US010991687B2

United States Patent
Tsai et al.

(10) Patent No.: US 10,991,687 B2
(45) Date of Patent: Apr. 27, 2021

(54) FINFET VARACTOR WITH LOW THRESHOLD VOLTAGE AND METHOD OF MAKING THE SAME

(71) Applicant: Taiwan Semiconductor Manufacturing Co., Ltd., Hsin-Chu (TW)

(72) Inventors: Fu-Huan Tsai, Kaohsiung (TW); Han-Min Tsai, Hsin-Chu (TW); Chia-Chung Chen, Keelung (TW); Chi-Feng Huang, Hsinchu County (TW); Victor Chiang Liang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/724,768

(22) Filed: Dec. 23, 2019

(65) Prior Publication Data
US 2020/0126975 A1  Apr. 23, 2020

Related U.S. Application Data

(60) Continuation of application No. 16/050,095, filed on Jul. 31, 2018, now Pat. No. 10,522,535, which is a (Continued)

(51) Int. Cl.
*H01L 21/8234* (2006.01)
*H01L 27/07* (2006.01)
(Continued)

(52) U.S. Cl.
CPC .... *H01L 27/0727* (2013.01); *H01L 21/26513* (2013.01); *H01L 29/41791* (2013.01);
(Continued)

(58) Field of Classification Search
CPC ......... H01L 27/0808; H01L 21/823431; H01L 21/823412; H01L 21/823493
See application file for complete search history.

(56) References Cited

U.S. PATENT DOCUMENTS 7,491,988 B2 * 2/2009 Tolchinsky ......... H01L 29/1054
257/192
7,560,798 B2  7/2009 Nowak
(Continued)

FOREIGN PATENT DOCUMENTS

| CN | 103928335 | 7/2014 |
| TW | 201318073 | 5/2013 |
| TW | 201539666 | 10/2014 |

OTHER PUBLICATIONS

Omura, Yasuhisa, "Phenomenalistic Reconsideration of Hooge Parameter in Buried-Channel Metal-Oxide-Semiconductor Field-Effect Transistors", 2001 IEEE International SOI Conference, Feb. 2001, pp. 51-52.

*Primary Examiner* — Jae Lee
(74) *Attorney, Agent, or Firm* — Haynes and Boone, LLP

(57) ABSTRACT

FinFET varactors having low threshold voltages and methods of making the same are disclosed herein. An exemplary FinFET varactor includes a fin and a gate structure disposed over a portion of the fin, such that the gate structure is disposed between a first source/drain feature and a second source/drain feature that include a first type dopant. The portion of the fin includes the first type dopant and a second type dopant. A dopant concentration of the first type dopant and a dopant concentration of the second type dopant vary from an interface between the fin and the gate structure to a first depth in the fin. The dopant concentration of the first type dopant is greater than the dopant concentration of the (Continued)

second type dopant from a second depth to a third depth in the fin, where the second depth and the third depth are less than the first depth.

20 Claims, 14 Drawing Sheets

Related U.S. Application Data division of application No. 15/394,412, filed on Dec. 29, 2016, now Pat. No. 10,522,534.

(60) Provisional application No. 62/329,929, filed on Apr. 29, 2016.

(51) Int. Cl.
    *H01L 29/66*     (2006.01)
    *H01L 29/93*     (2006.01)
    *H01L 21/265*     (2006.01)
    *H01L 29/417*     (2006.01)
    *H01L 29/49*     (2006.01)
    *H01L 27/06*     (2006.01)
    *H01L 29/78*     (2006.01)

(52) U.S. Cl.
    CPC ........ *H01L 29/495* (2013.01); *H01L 29/4966* (2013.01); *H01L 29/66795* (2013.01); *H01L 29/66803* (2013.01); *H01L 29/93* (2013.01); *H01L 27/0629* (2013.01); *H01L 29/66545* (2013.01); *H01L 29/785* (2013.01)

(56) References Cited

U.S. PATENT DOCUMENTS

| | | | |
|---|---|---|---|
| 7,682,919 | B2 | 3/2010 | Johansson |
| 7,741,138 | B2 * | 6/2010 | Cho .................... H01L 29/1041 |
| | | | 438/41 |
| 7,910,413 | B2 | 3/2011 | Zhu |
| 8,564,040 | B1 | 10/2013 | Doris et al. |
| 8,748,270 | B1 * | 6/2014 | Shifren ................. H01L 29/105 |
| | | | 438/275 |
| 9,064,725 | B2 | 6/2015 | Chen et al. |
| 9,082,698 | B1 | 7/2015 | Joshi et al. |
| 9,160,274 | B2 | 10/2015 | Hsieh et al. |
| 9,299,699 | B2 | 3/2016 | Lin et al. |
| 9,748,145 | B1 | 8/2017 | Kannan et al. |
| 2006/0022282 | A1 * | 2/2006 | Wirbeleit ................ H01L 27/11 |
| | | | 257/403 |
| 2006/0197129 | A1 | 9/2006 | Wohlmuth |
| 2006/0220114 | A1 * | 10/2006 | Miyashita ....... H01L 21/823814 |
| | | | 257/335 |
| 2012/0217467 | A1 | 10/2012 | Tan et al. |
| 2013/0221418 | A1 * | 8/2013 | Mitchell ........... H01L 29/66825 |
| | | | 257/296 |
| 2013/0320421 | A1 | 12/2013 | Chiu et al. |
| 2015/0236133 | A1 | 8/2015 | Singh et al. |
| 2015/0318397 | A1 | 11/2015 | Zhu |
| 2015/0380249 | A1 | 12/2015 | Gouk et al. |
| 2017/0287919 | A1 | 10/2017 | Maillard et al. |

* cited by examiner

FINFET VARACTOR WITH LOW THRESHOLD VOLTAGE AND METHOD OF MAKING THE SAME

This is a continuation application of U.S. patent application Ser. No. 16/050,095, filed Jul. 31, 2018, which is a divisional application of U.S. patent application Ser. No. 15/394,412, filed Dec. 29, 2016, which is a non-provisional of and claims benefit of U.S. Provisional Patent Application Ser. No. 62/329,928, filed Apr. 29, 2016, all of which are herein incorporated by reference in their entirety.

BACKGROUND

MOS (metal-oxide-semiconductor) varactors are semiconductor devices that have a capacitance varying as a function of an applied voltage. Varactors are often used as tuning elements in circuits such as voltage controlled oscillators (VCOs), parameter amplifiers, phase shifters, phase locked loops (PLLs), and other tunable circuits. For example, by varying a voltage applied to a varactor, the frequency of operation of an associated VCO can be adjusted. Tunability, linearity, and quality factor are among the important characteristics of an MOS varactor.

As the semiconductor industry strives for higher device density, higher performance, and lower power, problems involving MOS varactor fabrication and design have been encountered, particularly with FinFET varactors in advanced process nodes such as 16 nanometer (nm) or smaller. For example, it has been found that FinFET varactors sometimes do not provide good tunability and linearity for ultra-low power circuits. For example, a linear tuning region of a FinFET varactor may be centered on a gate voltage (Vg) greater than 0 (zero) volts such as 0.3V, and may become almost un-tunable when Vg swings near 0V. That means a VCO circuit needs to provide a Vg biasing near 0.3V, while an ideal Vg biasing is near 0V for achieving ultra-low power consumption in the circuit. Accordingly, improvements in FinFET varactor design and fabrication are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
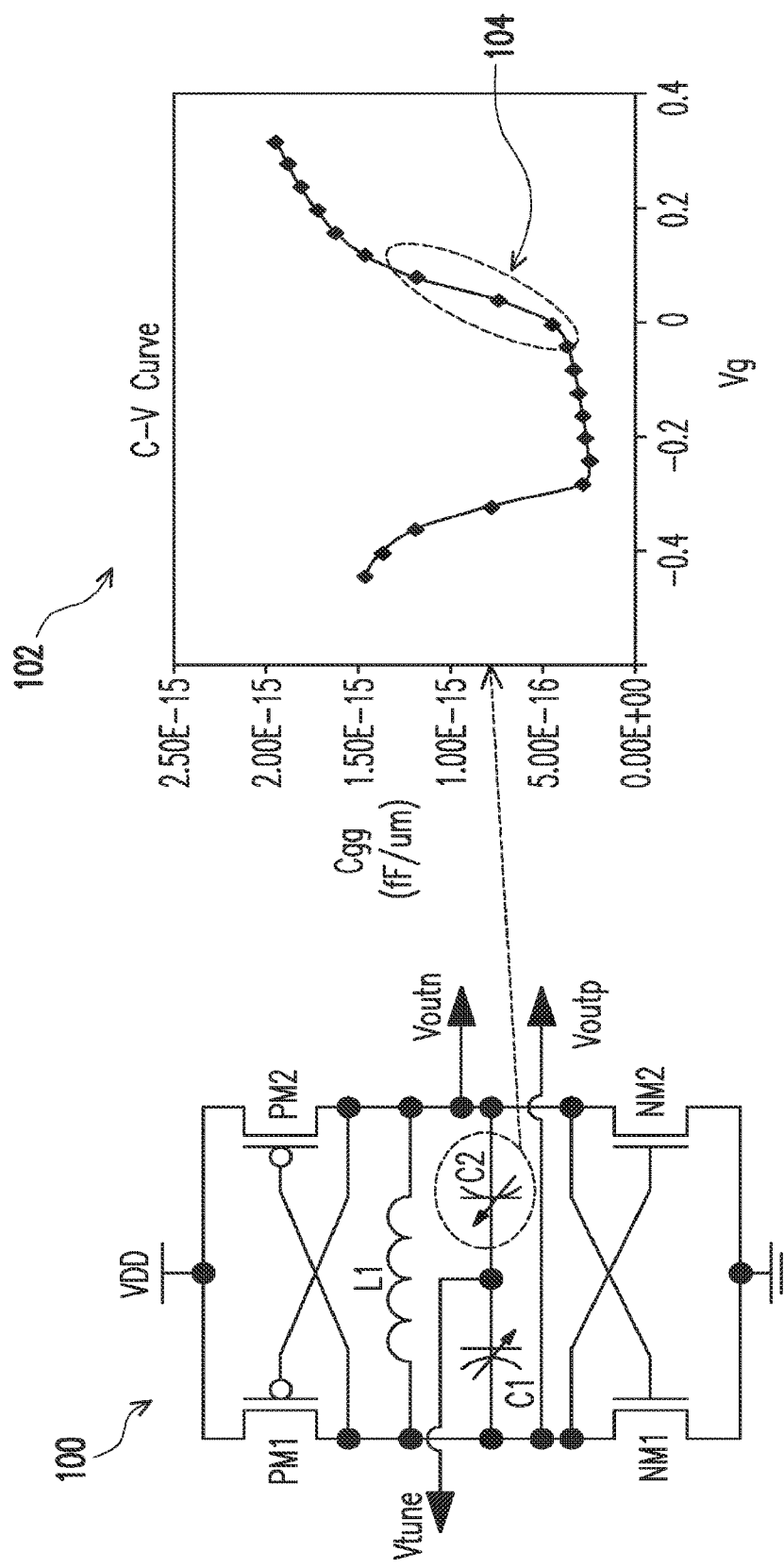
FIG. 1 illustrates a VCO circuit having a MOS varactor constructed according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to MOS varactors, and more particularly to FinFET varactors having a low threshold voltage (Vt) and methods of making the same. FinFET varactors having a low Vt, such as a Vt near 0V, are greatly desired for ultra-low power applications. For example, they can be used in today's mobile devices such as smart phones and tablets where users demand ultra-low power consumption. However, the provided subject matter can be applied to other types of varactors, such as varactors formed with planar transistors instead of FinFETs, as well as varactors formed with other types of multi-gate transistors in addition to FinFETs.

FIG. 1 shows a VCO circuit (or design) 100 which may benefit from aspects of the present disclosure. Referring to FIG. 1, the VCO 100 includes a FinFET varactor C2 for tuning an operation frequency of the VCO 100. The FinFET varactor C2 is constructed according to an embodiment of the present disclosure, which will be described in details later. The VCO 100 further includes PMOSFETs (p-type MOS field-effect transistors) PM1 and PM2, NMOSFET (n-type MOSFETs) NM1 and NM2, another capacitor C1, an inductor L1, terminals connected to VDD (positive power supply) and GND (ground), and various output terminals Vtune, Voutn, and Voutp. FIG. 1 also illustrates a C-V curve 102 of the FinFET varactor C2 under certain working condition. A near-linear tuning range 104 of the FinFET varactor C2 is centered on a Vg that is at or close to 0V, such as ranging from 0 to 0.1V. That means a biasing voltage applied to the FinFET varactor C2 may be set to 0V or near 0V, which greatly reduces the power consumption of the VCO circuit 100.

Figure 2:
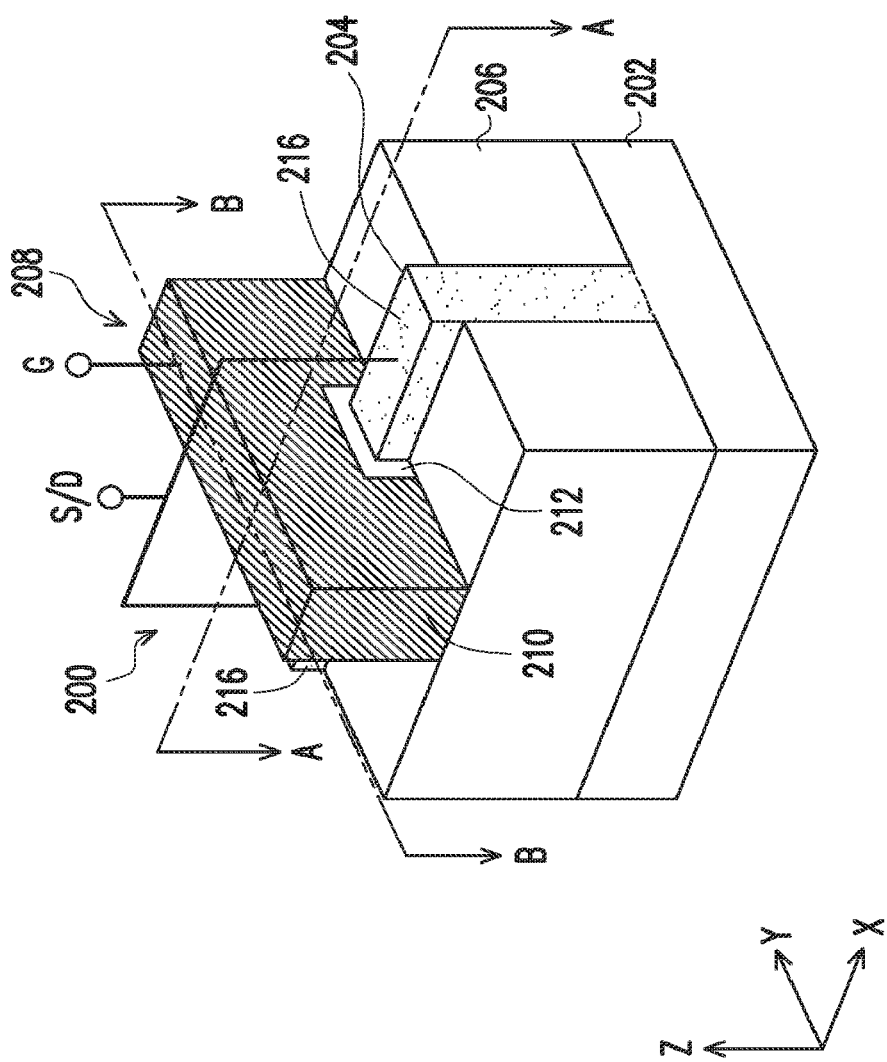
FIG. 2 illustrates a FinFET varactor according to aspects of the present disclosure.

FIG. 2 illustrates a fragmentary perspective view of a FinFET varactor 200, such as the FinFET varactor C2 of FIG. 1, according to various aspects of the present disclosure. Referring to FIG. 2, the FinFET varactor 200 includes a substrate 202, an isolation feature 206 and a fin 204 protruding out of the substrate 202 and through the isolation feature 206. The FinFET varactor 200 further includes a gate stack 208 having a gate dielectric layer 212 and a gate electrode 210. The gate electrode 210 may include one or more layers such as a work function metal layer, a metal barrier layer, a metal fill layer, and so on. The work function metal layer may be a p-type or an n-type work function layer. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), or combinations thereof. The metal fill layer may include aluminum (Al), tungsten (W), cobalt (Co), copper (Cu), and/or other suitable materials.

The gate dielectric layer 212 may comprise a high-k dielectric material such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. The FinFET varactor 200 may further include an interfacial layer between the fin 204 and the gate dielectric layer 212, which may include a dielectric material such as silicon oxide layer ($SiO_2$) or silicon oxynitride (SiON).

Still referring to FIG. 2, the fin 204 includes a channel region (not shown) under the gate stack 208, and source and drain (S/D) regions 216 on opposite sides of the channel region. The gate stack 208 engages the fin 204 in the channel region on three sides of the fin 204. In the S/D regions 216, the FinFET varactor 200 may further include S/D features, such as lightly doped S/D features, heavily doped S/D features, silicide features, and raised S/D features. In the following discussion, unless otherwise noted, S/D regions and S/D features are used interchangeably. As shown in FIG. 2, the S/D regions 216 of the FinFET varactor 200 are connected to a common S/D terminal and the gate stack 208 is connected to a G (gate) terminal, thereby forming a two-terminal capacitor. The S/D terminal and the G terminal correspond to the two terminals of C2 in FIG. 1. In some applications, the FinFET varactor 200 works in an inversion mode, i.e. it works in a range where its capacitance increases as Vg (voltage across the G terminal and the S/D terminal) increases, as exemplarily shown on the right part of the C-V curve 102 of FIG. 1.

The substrate 202 may comprise silicon or another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an alternative embodiment, the substrate 202 is a semiconductor on insulator (SOI) substrate. The fin 204 may comprise silicon, germanium, or other semiconductor materials.

Figure 3A:
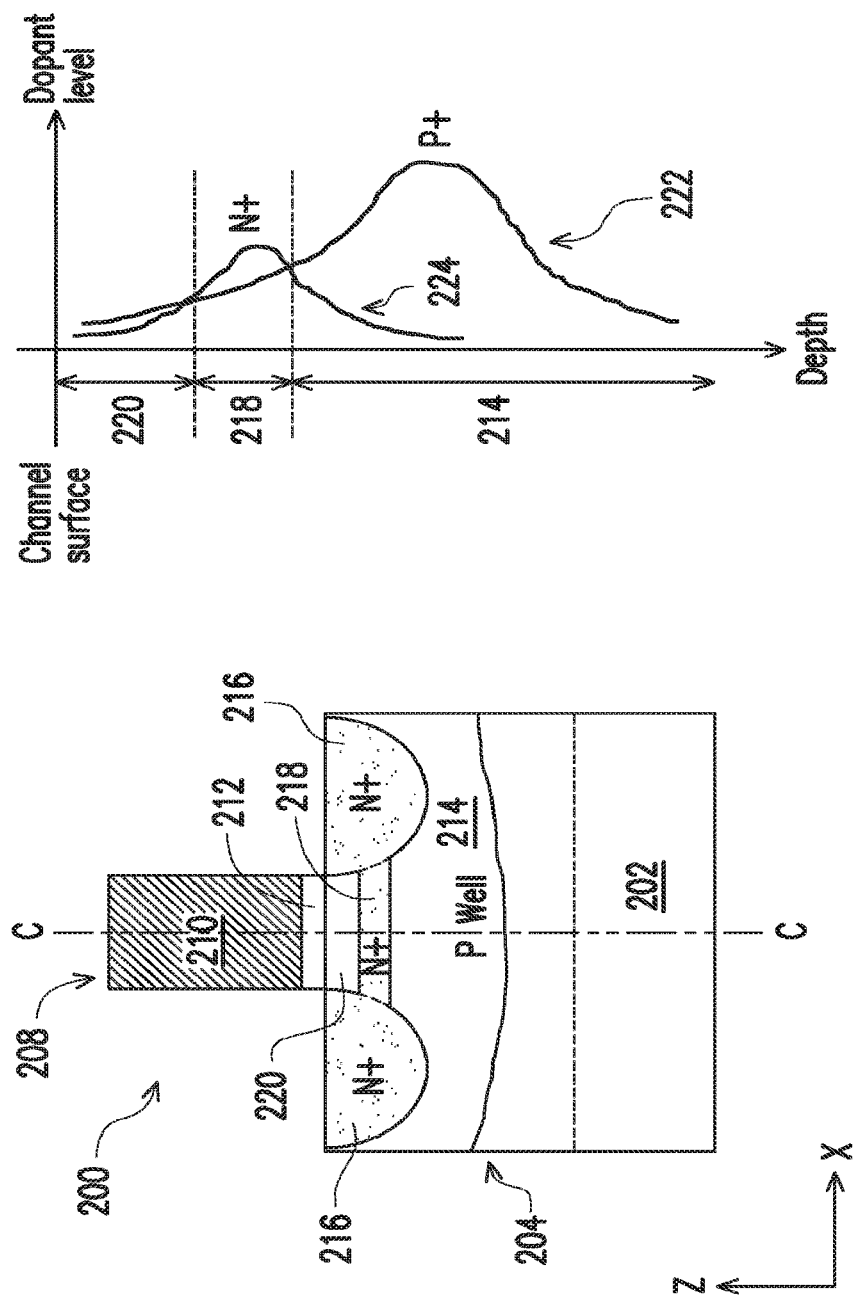
FIGS. 3A and 3B show fragmentary schematic views of the FinFET varactor of FIG. 2, in accordance with some embodiments.

FIG. 3A shows a cross-sectional view of the FinFET varactor 200 along the A-A line of FIG. 2, in accordance with an embodiment. Referring to FIG. 3A, the FinFET varactor 200 is an NMOS (or n-type) FinFET varactor in this embodiment. The fin 204 includes a well 214, which is a P well in this embodiment. For example, the P well 214 is formed by doping the substrate 202 with a p-type dopant such as boron, indium, or other suitable materials. The FinFET varactor 200 includes n-type doped S/D regions 216 on both sides of the gate stack 208. In an embodiment, the S/D regions 216 are heavily doped with an n-type dopant such as phosphorus, arsenic, or combinations thereof. The FinFET varactor 200 further includes an n-type doped region 218 electrically connecting the S/D regions 216. In a typical NMOS FinFET varactor, the region between the S/D regions 216 is not doped with an n-type dopant, or is dominated by the p-type dopant of the well 214. The present embodiment implements a counter-doping technique to form the region 218, which helps reduce threshold voltage in the FinFET varactor 200.

FIG. 3A further shows doping profiles of the n-type and p-type dopants in the fin 204 along the C-C line of FIG. 3A. Referring to FIG. 3A, curves 222 and 224 illustrate the doping profiles of the p-type dopant and n-type dopant respectively. The dopant level (or dopant concentration) of the p-type dopant peaks in the fin 204 at a depth below the region 218. The dopant level of the n-type dopant peaks in the region 218. Particularly, the dopant level of the n-type dopant exceeds that of the p-type dopant in the region 218, which creates an n-type doping net effect in the region 218 ("counter-doping"). The n-type doped region 218 leads to lowered Vt (threshold voltage) of the NMOS FinFET varactor 200. As a result, the linear tuning range of the FinFET varactor 200 is shifted lower (to the left of the C-V curve) and settles near 0V, as shown in FIG. 1. In an embodiment, the region 218 may be formed at or near 50 nm below the surface of the channel region, and may have a thickness ranging from few nanometers (nm) to few tens of nanometers, such as from 2 nm to 10 nm. Below the region 218, the p-type dopant dominates, creating a p-type doping net effect. Above the region 218 is a region 220 where either the n-type dopant or the p-type dopant may dominate. In the example shown, the p-type dopant level is higher than the n-type dopant level, creating a p-type doping net effect in the region 220. In another embodiment, the n-type dopant level is higher than the p-type dopant level, creating an n-type doping net effect in the region 220. Furthermore, in this embodiment shown in FIG. 3A, the peak of curve 222 is higher than the peak of curve 224. However, this is not limiting. In another embodiment, the peak of curve 222 may be equal to or lower than the peak of curve 224 in the NMOS FinFET varactor 200.

Figure 3B:
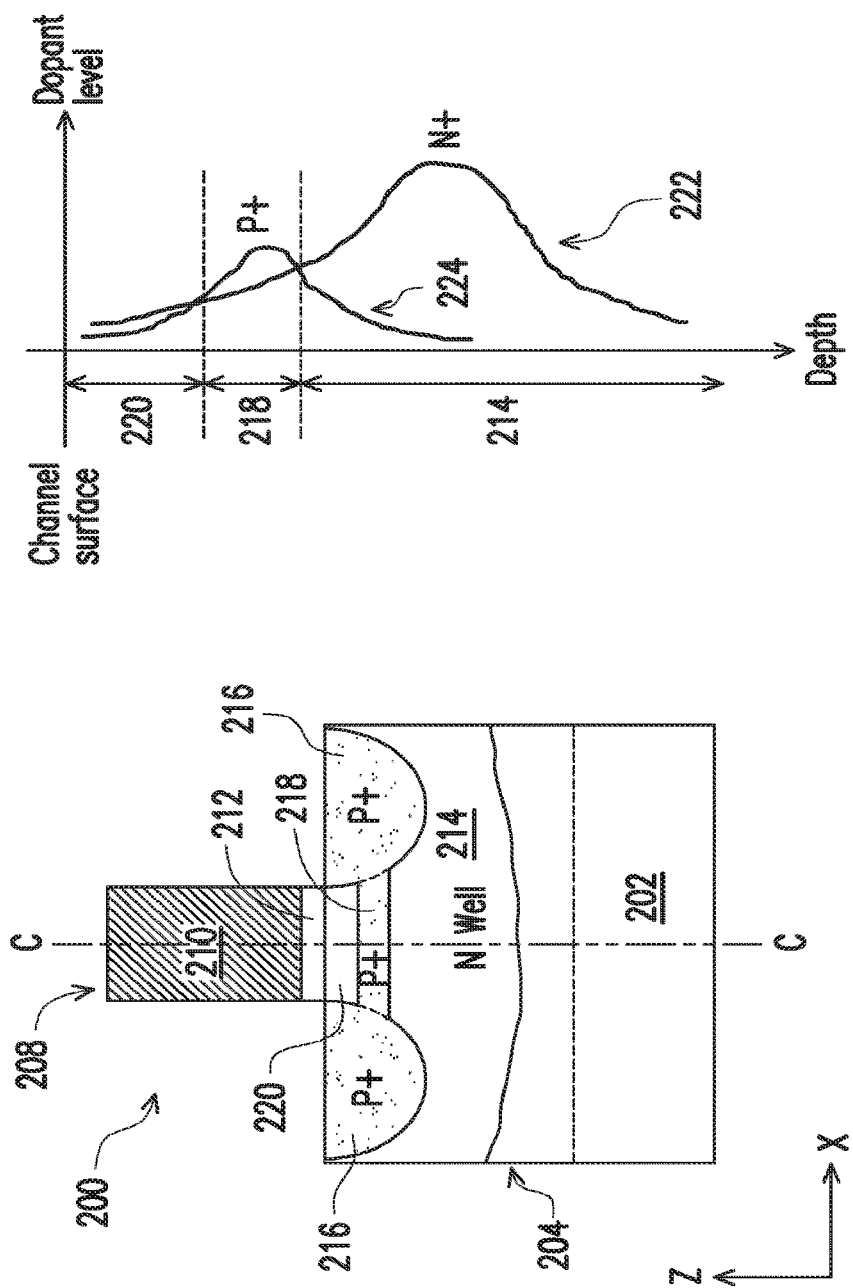

FIG. 3B shows a cross-sectional view of the FinFET varactor 200 along the A-A line of FIG. 2, in accordance with another embodiment. Referring to FIG. 3B, the FinFET varactor 200 is a PMOS FinFET varactor in this embodiment. The fin 204 includes an N well 214. In an example, the N well 214 is formed by doping the substrate 202 with an n-type dopant such as phosphorus, arsenic, or combinations thereof. The FinFET varactor 200 includes p-type doped S/D regions 216 on both sides of the gate stack 208. In an embodiment, the S/D regions 216 are heavily doped with a p-type dopant such as boron or indium. The FinFET varactor 200 further includes a p-type doped region 218 electrically connecting the S/D regions 216. In a typical PMOS FinFET varactor, the region between the S/D regions 216 is not doped with a p-type dopant, or is dominated by the n-type dopant of the well 214. The present embodiment implements a counter-doping technique to form the region 218, which helps reduce threshold voltage in the FinFET varactor 200.

FIG. 3B further shows doping profiles of the n-type and p-type dopants in the fin 204 along the C-C line of FIG. 3B. Referring to FIG. 3B, curves 222 and 224 illustrate the doping profiles of the p-type dopant and n-type dopant respectively. The dopant level of the n-type dopant peaks in the fin 204 at a depth below the region 218. The dopant level of the p-type dopant peaks in the region 218. Particularly, the dopant level of the p-type dopant exceeds that of the n-type dopant in the region 218, which creates a p-type doping net effect in the region 218 ("counter-doping"). The p-type doped region 218 leads to lowered Vt (threshold voltage) of the PMOS FinFET varactor 200. As a result, the linear tuning range of the FinFET varactor 200 is shifted to near 0V, as shown in FIG. 1. In an embodiment, the region 218 may be formed at or near 50 nm below the surface of the channel region, and may have a thickness ranging from few nanometers (nm) to tens of nanometers such as from 2 nm to 10 nm. Below the region 218, the n-type dopant dominates, creating an n-type doping net effect. Above the region 218 is a region 220 where either the n-type dopant or the p-type dopant may dominate. In the example shown, the n-type dopant level is higher than the p-type dopant level, creating an n-type doping net effect in the region 220. In another embodiment, the p-type dopant level is higher than the n-type dopant level, creating a p-type doping net effect in the region 220. Furthermore, in this embodiment shown in FIG. 3B, the peak of curve 224 is higher than the peak of curve 222. However, this is not limiting. In another embodiment, the peak of curve 224 may be equal to or lower than the peak of curve 222 in the PMOS FinFET varactor 200.

Figure 4:
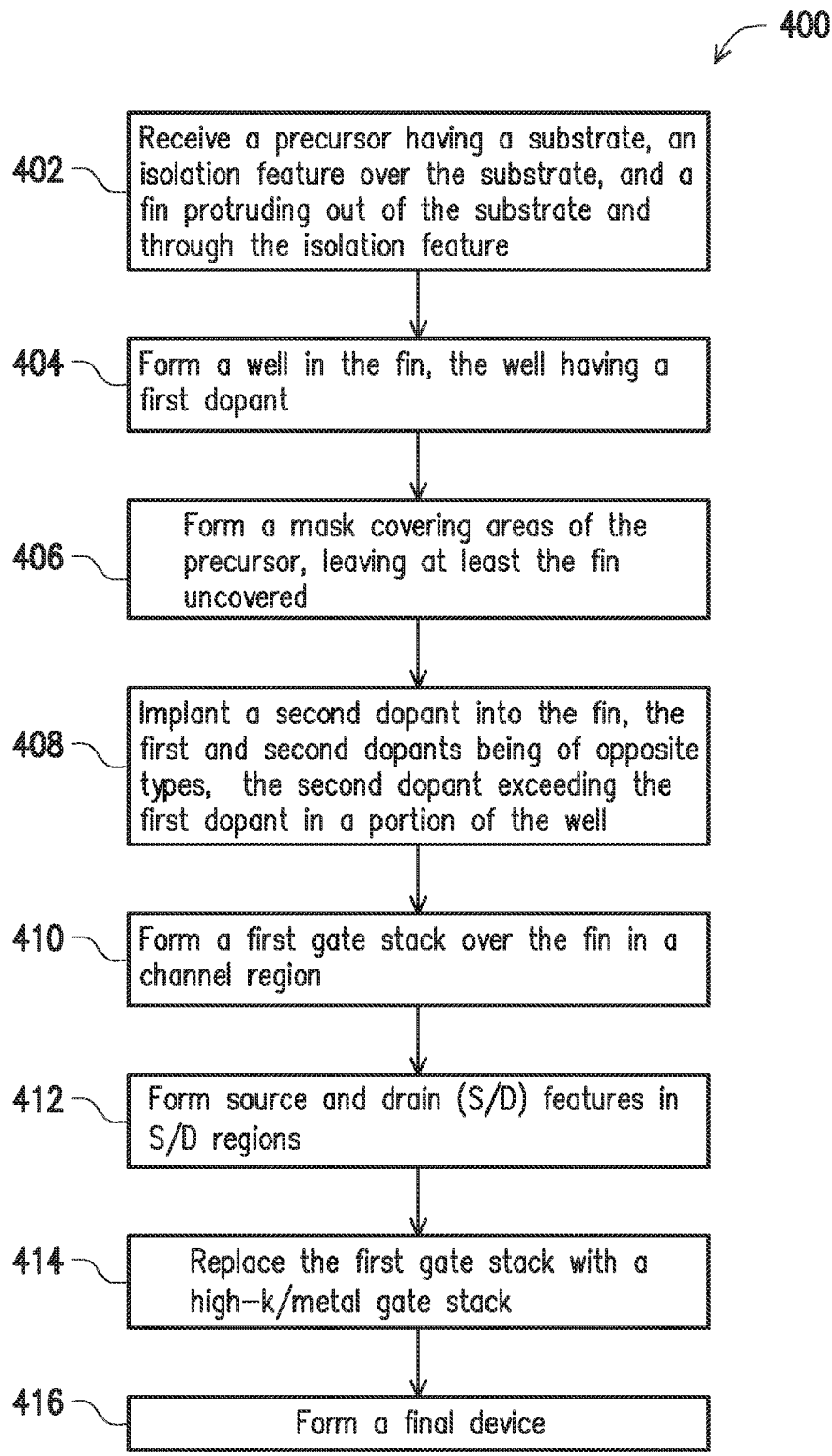
FIG. 4 shows a flow diagram of a method of forming a device having a FinFET varactor, according to various aspects of the present disclosure.
Figure 5B:
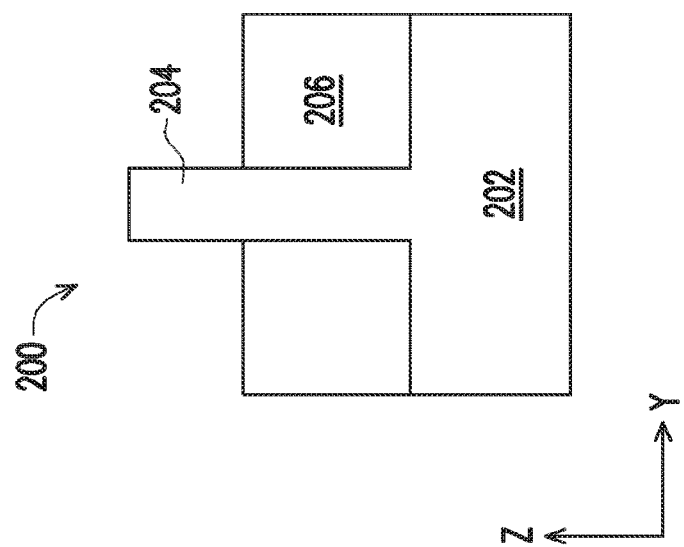
FIGS. 5A, 5B, 6A, 6B, 7, 8A, 8B, 9A, 9B, 10A, 10B, 11A, 11B, 12A, 12B, 13A, and 13B are cross-sectional or top views of forming a FinFET device according to the method of FIG. 4, in accordance with some embodiments.
Figure 5A:
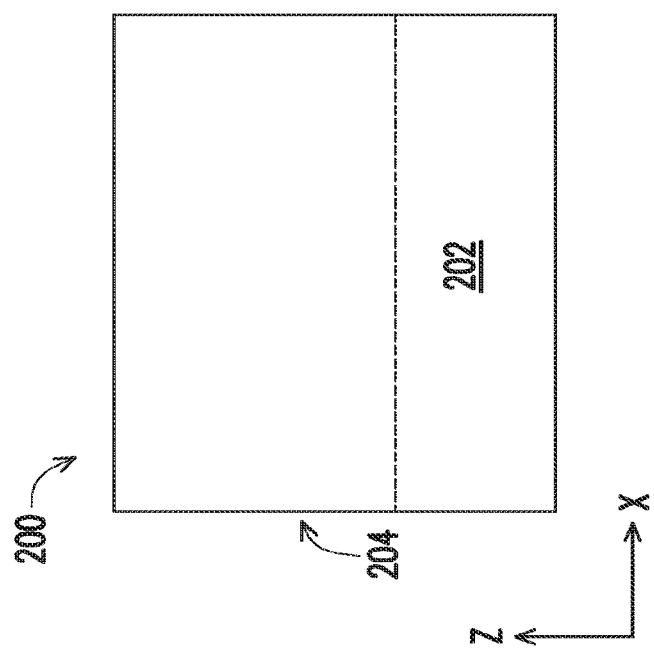
Figure 6A:
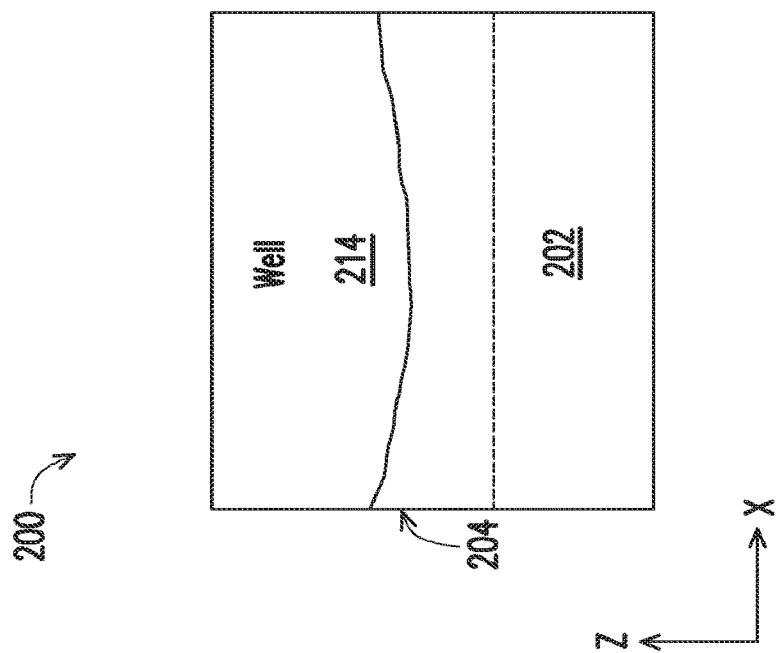
Figure 6B:
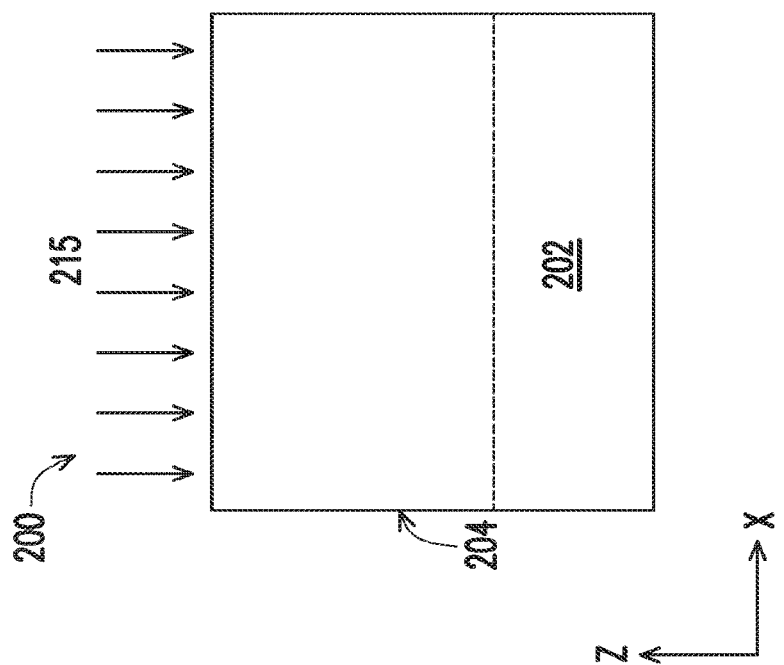
Figure 7:
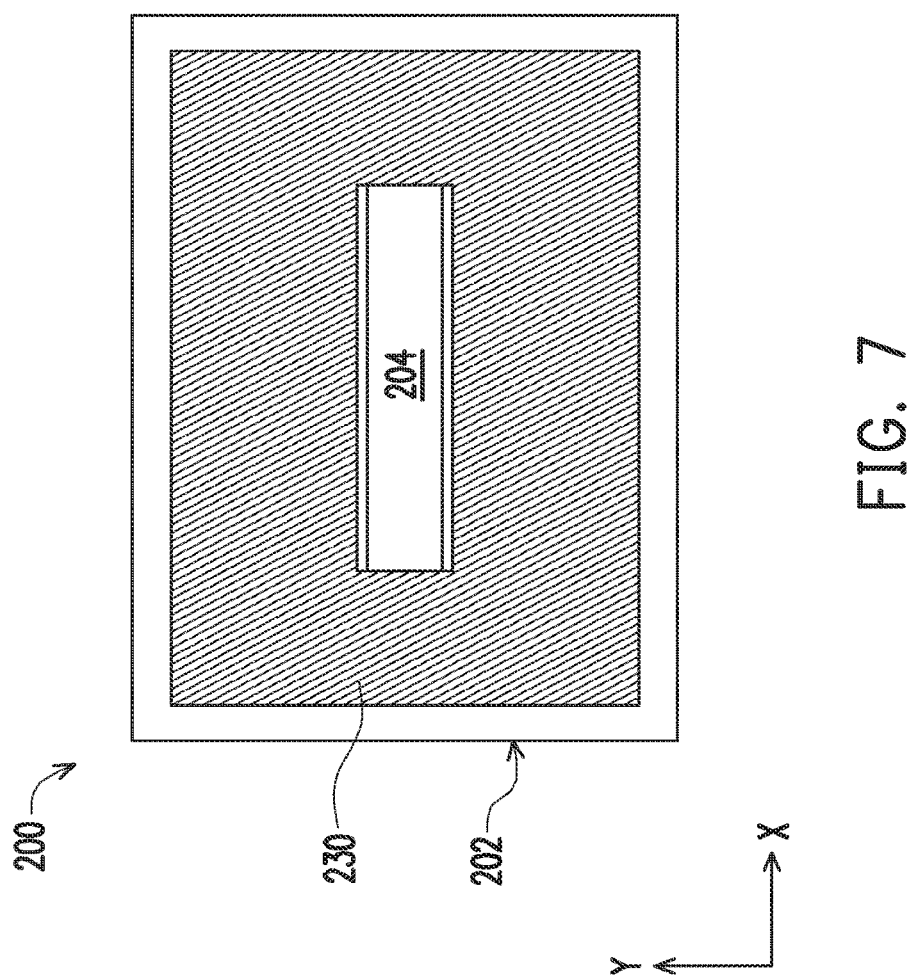

FIG. 4 shows a block diagram of a method 400 of forming a FinFET device having a FinFET varactor according to various aspects of the present disclosure. The method 400 is merely an example, and is not intended to limit the present disclosure beyond what is explicitly recited in the claims. Additional operations can be provided before, during, and after the method 400, and some operations described can be replaced, eliminated, or moved around for additional embodiments of the method. The method 400 is described below in conjunction with FIGS. 5A-13B which are top or cross-sectional views of a FinFET device 200 according to various aspects of the present disclosure. Specifically, FIGS. 5A, 6A, 6B, 8A, 9A, 10A, 11A, 12A, and 13A are cross-sectional views of the FinFET device 200 along the "A-A" line of FIG. 2; FIGS. 5B, 8B, 9B, 10B, 11B, 12B, and 13B are cross-sectional views of the FinFET device 200 along the "B-B" line of FIG. 2; and FIG. 7 is a top view of the FinFET device 200.

The FinFET device 200 may be an intermediate device fabricated during processing of an integrated circuit (IC), or a portion thereof, that may comprise static random access memory (SRAM) and/or other logic circuits, passive components such as resistors, capacitors, and inductors, and active components such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

At operation 402, the method 400 (FIG. 4) receives a precursor of the device 200. For the convenience of discussion, the precursor is also referred to as the device 200. Referring to FIG. 5A, the device 200 includes a substrate 202, an isolation feature 206 disposed over the substrate 202, and a fin 204. The fin 204 extends upwardly from the substrate 202 and protrudes out of the isolation feature 206. The substrate 202 is a silicon substrate in the present embodiment. Alternatively, the substrate 202 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 202 is a semiconductor on insulator (SOI). The substrate 202 may include buried oxide and strained features.

In some embodiments, the fin 204 is formed from the substrate 202 using suitable processes including photolithography and etching processes. The photolithography processes include forming a photoresist layer (resist) overlying the substrate 202, exposing the resist to a pattern, performing post-exposure bake processes, and developing the resist to form a masking element including the resist. The masking element is then used for etching recesses into the substrate 202, leaving the fin 204 on the substrate 202. The etching process can include dry etching, wet etching, reactive ion etching (RIE), and/or other suitable processes. Alternatively, the fins 204 may be formed by etching trenches into the isolation feature 206 and epitaxially growing semiconductor materials in the trenches as the fins 204.

The isolation feature 206 may include silicon oxide or other suitable dielectric material. In an embodiment, the isolation feature 206 is formed by depositing one or more dielectric materials over the substrate 202 after the fin 204 is formed, and is then recessed by one or more etching processes. For example, the one or more dielectric materials may be deposited by chemical vapor deposition (CVD) processes, and the etching processes may include dry etching, wet etching, and other suitable etching process.

At operation 404, the method 400 (FIG. 4) forms a well 214 in the fin 204. In an embodiment, operation 404 includes a well ion implantation process which implants one or more p-type dopants 215 (for NMOS FinFET 200) or n-type dopants 215 (for PMOS FinFET 200) into the fin 204 (FIG. 6A). In an embodiment, the well 214 includes an n-type dopant 215, such as phosphorous, arsenic, or other suitable dopants, making it an N well. To further this embodiment, the well ion implantation process may implant the n-type dopant 215 with a doping dose ranging from $1e^{11}$ to $1e^{14}$ ion/$cm^2$ and an energy level ranging from 10 to 1,000 keV. In another embodiment, the well 214 includes a p-type dopant 215, such as boron, indium, or other suitable dopants, making it a P well. To further this embodiment, the well ion implantation process may implant the p-type dopant 215 with a doping dose ranging from $1e^{11}$ to $1e^{14}$ ion/$cm^2$ and an energy level ranging from 10 to 1,000 keV. The operation 404 may further include an annealing process at an elevated temperature to activate the dopants and/or remove implantation damage to the fin 204 after the well ion implantation. After the well ion implantation and the optional annealing processes, the well 214 is formed in the fin 204, as illustrated in FIG. 6B.

At operation 406, the method 400 (FIG. 4) forms a mask 230 covering parts of the device 200, but leaving the fin 204 uncovered. Referring to FIG. 7, the mask 230 is disposed over the device 200 with an opening where the fin 204 is exposed. The mask 230 covers various areas of the device 200 so that next operation (operation 408) does not impact those areas. The mask 230 may be a photoresist or a hardmask in some embodiments, and may be formed by one or more photolithography processes.

Figure 8B:
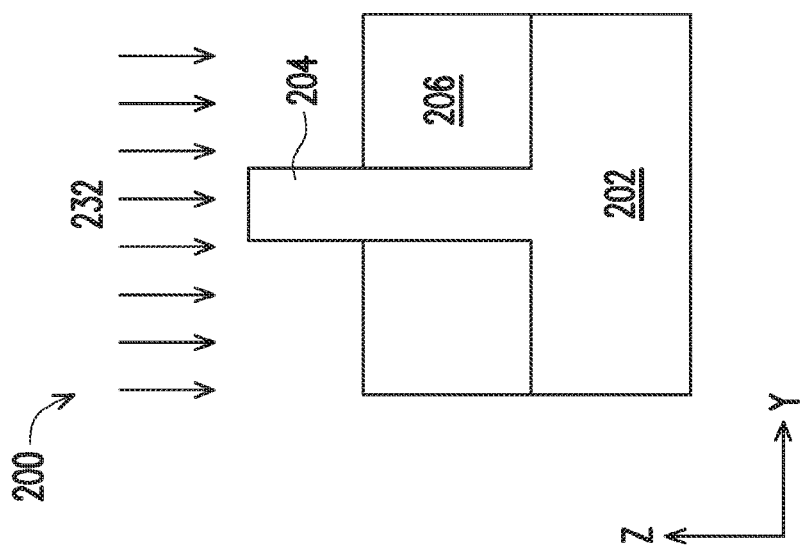
Figure 8A:
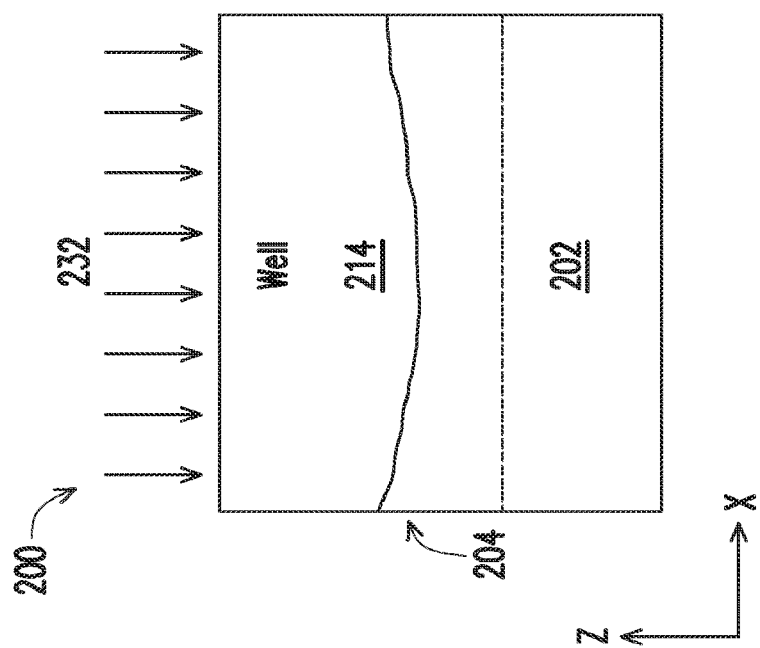

At operation 408, the method 400 (FIG. 4) performs a channel ion implantation to the fin 204. Referring to FIGS. 8A and 8B, the channel ion implantation introduces a dopant 232 into the fin 204. The dopant 232 is of an opposite type than the dopant(s) 215 existing in the well 214. In an embodiment, the well 214 is a P well (doped with a p-type dopant 215), and the dopant 232 is an n-type dopant such as phosphorus, arsenic, a combination thereof, or another suitable dopant. To further this embodiment, the channel ion implantation process may implant the n-type dopant 232 with a doping dose ranging from $1e^{12}$ to $1e^{14}$ ion/$cm^2$ and an energy level ranging from 10 to 50 keV. In another embodiment, the well 214 is an N well (doped with an n-type dopant 215), and the dopant 232 is a p-type dopant such as boron, indium, a combination thereof, or another suitable dopant. To further this embodiment, the channel ion implantation process may implant the p-type dopant 232 with a doping dose ranging from $1e^{12}$ to $1e^{14}$ ion/cm$^2$ and an energy level ranging from 10 to 50 keV.

In an embodiment, operation 408 implants the dopant 232 to not only the channel region of the fin 204, but also the S/D regions of the fin 204. Since the S/D regions of the fin 204 will have the same type of dopant as the dopant 232, such implantation is desirable and may be used as lightly doped S/D features. In another embodiment, operation 408 dopes only the channel region of the fin 204 by masking the S/D regions of the fin 204 during the channel ion implantation. The operation 408 may further include an annealing process at an elevated temperature to activate the dopants and/or remove implantation damage to the fin 204 after the channel ion implantation.

Figure 9B:
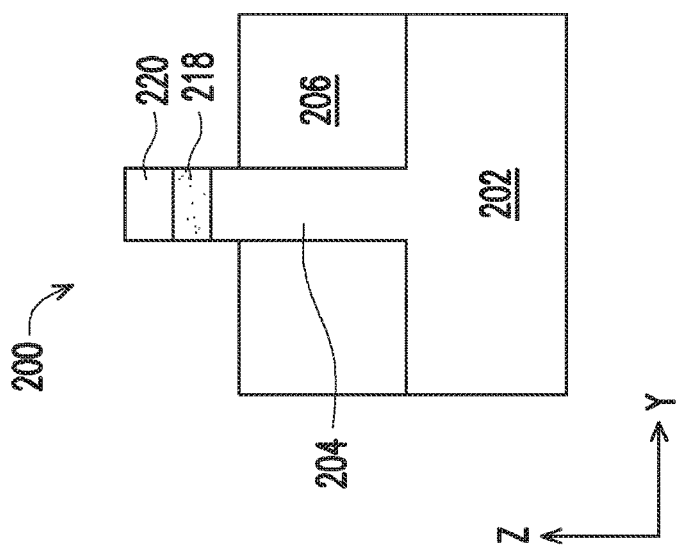
Figure 9A:
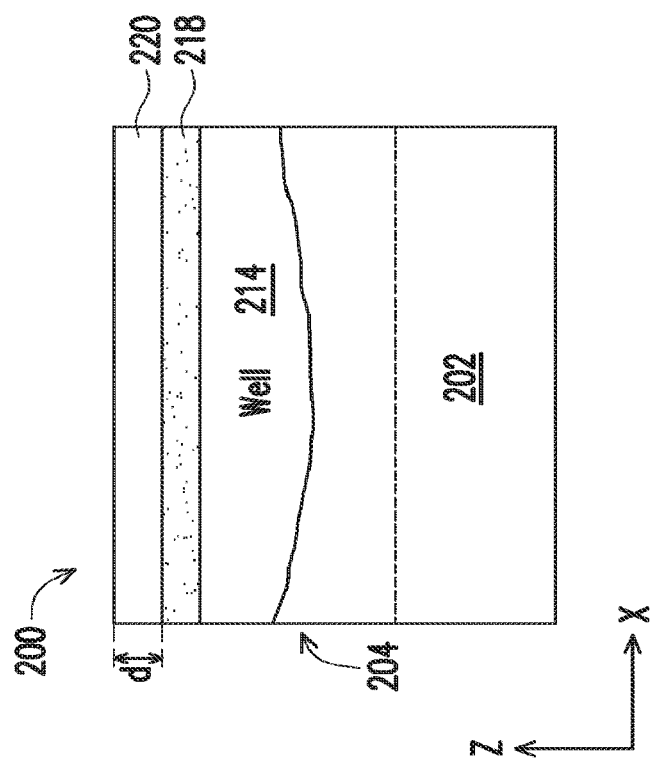

After the channel ion implantation process and the optional annealing process, a region 218 is formed in the fin 204 at a depth "d," as shown in FIGS. 9A and 9B. The depth d is around 50 nm in an embodiment and can be tuned to range from few nanometers to few tens of nanometers in various embodiments. The region 218 is oppositely doped than the well 214, as discussed above. Further, FIG. 9A shows that the region 218 stretches from the source region to the drain region. It is noted that an actual shape of the region 218 may not be as regular as illustrated in FIG. 9A. The mask 230 is removed after the operation 408.

The process conditions for the well ion implantation (FIG. 6A) and the channel ion implantation (FIG. 8A) are tuned such that an appropriate dopant profile, such as the dopant profiles 222 and 224 shown in FIGS. 3A and 3B, is formed in the fin 204. For example, the peak doping level of the dopant 232 is formed at a first depth (e.g., 50 nm) beneath the fin surface for tuning the Vt of the FinFET varactor 200 and for connecting the S/D features 216 (FIGS. 3A and 3B). At the same time, the peak doping level of the dopant 215 is formed at a second depth that is deeper than the first depth. This is generally a result of the doping energy in the well ion implantation being higher than that in the channel ion implantation. Both the doping concentration level and doping depth may be tuned, for example, by changing the doping dose level and/or the doping energy level. For an example, the doping depth generally increases when the doping energy increases. As a particular example, the channel ion implantation uses a doping energy ranging from 10 to 50 keV such that the region 218 is formed at a depth suitable for connecting the S/D features 216. For another example, the doping concentration level generally increases when the doping dose increases. A higher doping concentration of the dopant 232 in the region 218 generally leads to a lower device Vt. The characteristics of the region 218 (e.g., the doping concentration level and the depth) may be designed in conjunction with the work function of the gate 208 (FIGS. 3A and 3B) to obtain a desirable C-V curve of the varactor 200, such as the C-V curve 102 of FIG. 1.

Figure 10B:
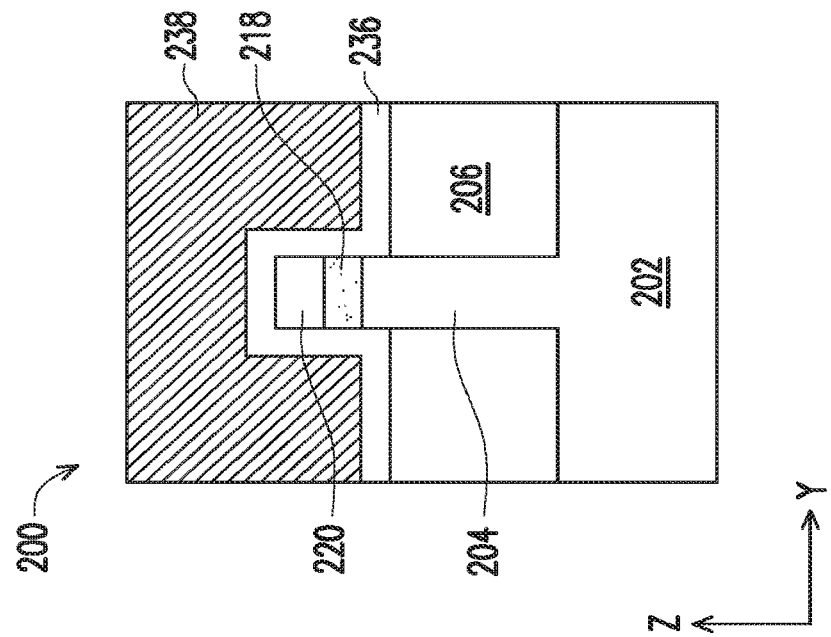
Figure 10A:
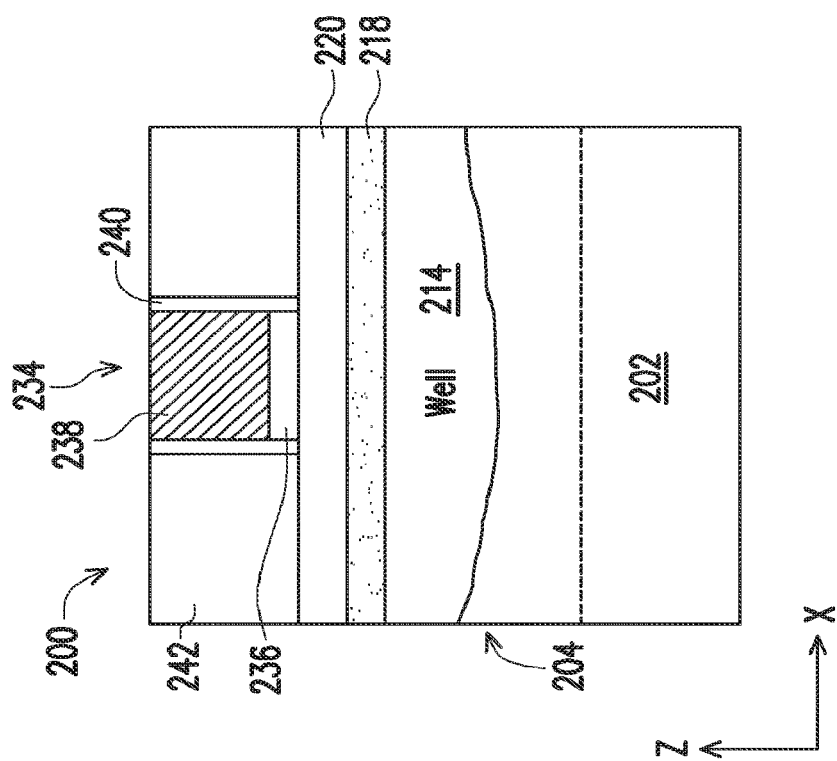

At operation 410, the method 400 (FIG. 4) forms a first gate stack 234 over the fin and above the channel region, as shown in FIGS. 10A and 10B. Referring to FIG. 10A, the gate stack 234 includes multiple layers, such as a gate dielectric layer 236 and a polysilicon (or poly) layer 238. The gate dielectric layer 236 may include a dielectric material such as silicon oxide ($SiO_2$) or silicon oxynitride (SiON); and may be formed by chemical oxidation, thermal oxidation, atomic layer deposition (ALD), chemical vapor deposition (CVD), and/or other suitable methods. The poly layer 238 may be formed by suitable deposition processes such as low-pressure chemical vapor deposition (LPCVD) and plasma-enhanced CVD (PECVD). The gate stack 234 may further include other layers, such as an interfacial layer, a metal gate layer, and/or other material layers. FIG. 10A further shows a spacer 240 formed on sidewalls of the gate stack 234. The spacer 240 may include one layer or multiple layers, and may contain silicon nitride, silicon oxide, silicon oxynitride, and/or other dielectric materials. The spacer 240 may be formed by a process including a deposition process and an anisotropic etching process.

As discussed earlier, the provided subject matter can be similarly applied to fabricating planar FET devices. In another embodiment, the fin 204 is a planar layer comprising one or more semiconductor materials, and the gate stack 234 is disposed only on a top surface of the planar layer, thereby forming a planar FET instead of a FinFET.

Figure 11B:
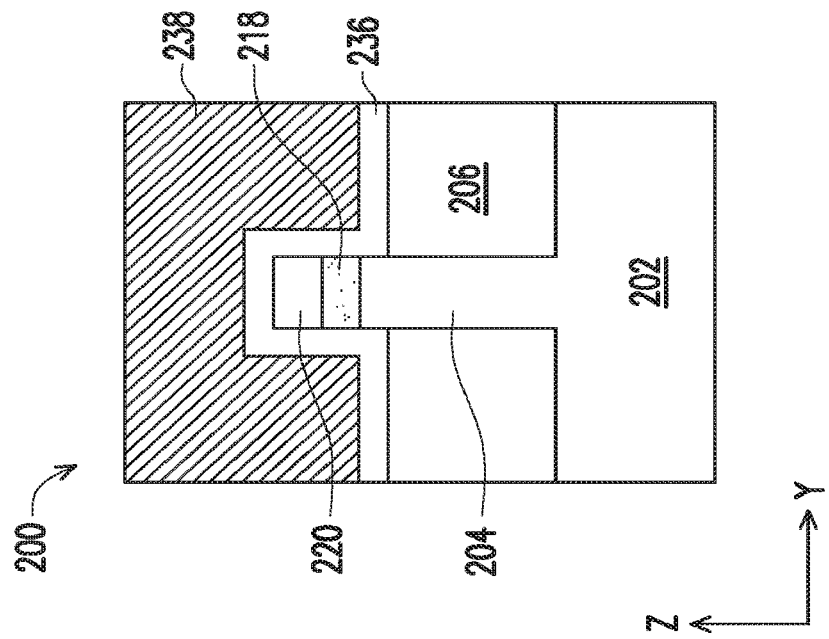
Figure 11A:
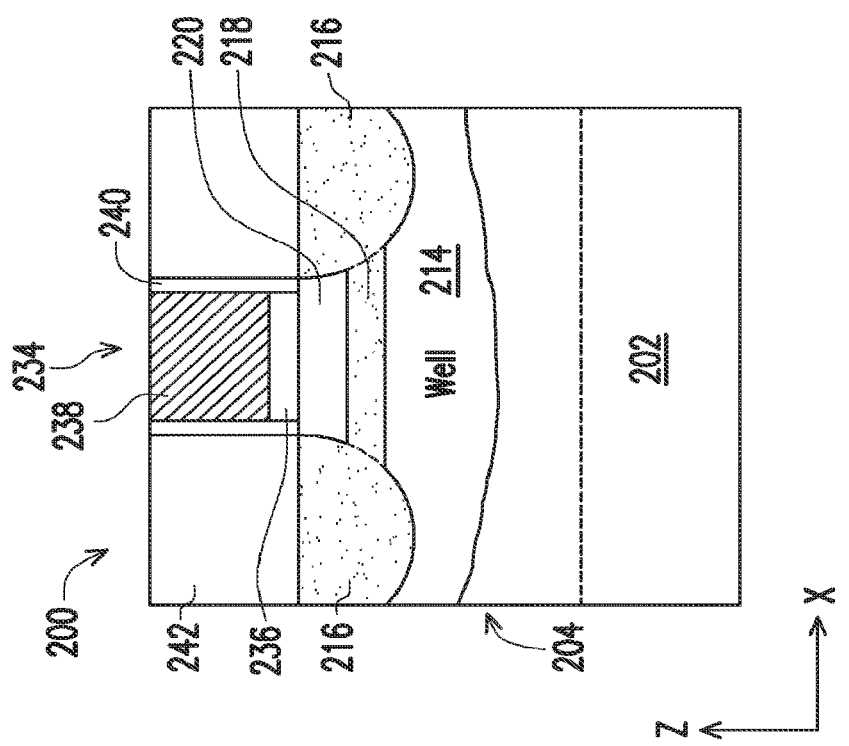

At operation 412, the method 400 (FIG. 4) forms S/D features 216 in or on the S/D regions of the fin 204. Referring to FIGS. 11A and 11B, the S/D features 216 are formed on both sides of the gate stack 234. Particularly, the S/D features 216 are connected through the region 218 in the present embodiment. In an embodiment, the S/D features 216 are formed in the fin 204 by heavily doping the S/D regions thereof. The dopants in the S/D features 216 are of the same type as that in the region 218. For example, they are both n-type dopant for an NMOS FinFET varactor 200, or they are both p-type dopant for a PMOS FinFET varactor 200. However, the dopant concentration in the S/D features 216 is much higher than that in the region 218. For example, the dopant concentration in the S/D features 216 may be on the order of $1e^{20}$ cm$^{-3}$ while the dopant concentration in the lightly doped region 218 may be on the order of $1e^{18}$ cm$^{-3}$. In another embodiment, the S/D features 216 are formed by etching the S/D regions of the fin 204 to form recesses and epitaxially growing a semiconductor material in the recesses. The semiconductor material may be in-situ or ex-situ doped with the proper dopant as discussed above. The S/D features 216 may include other features, such as silicides.

Figure 12B:
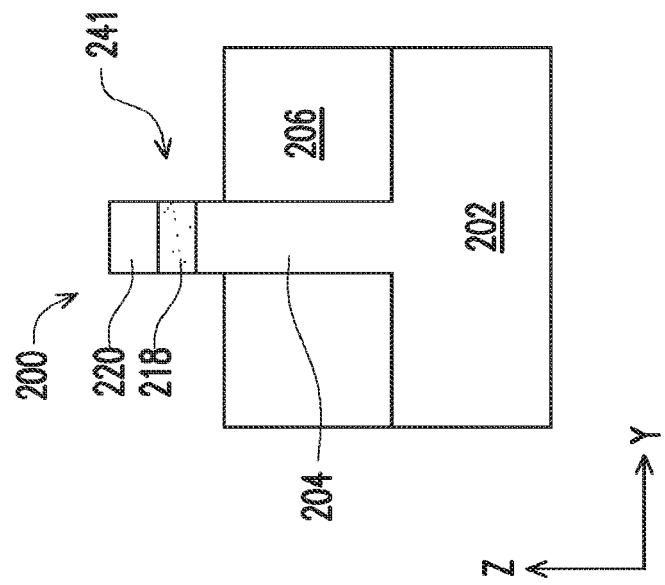
Figure 12A:
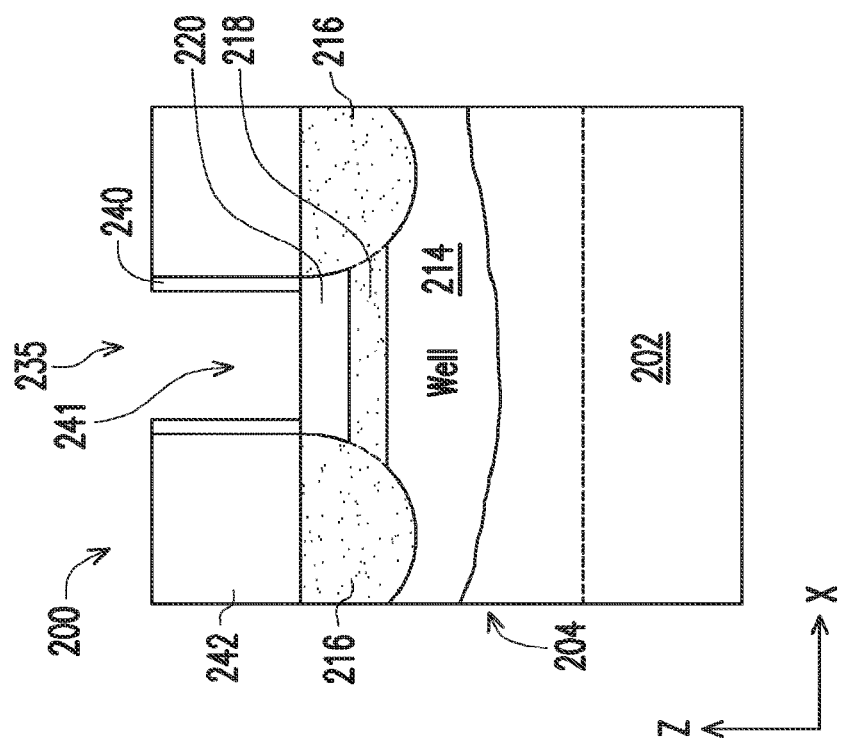

At operation 414, the method 400 (FIG. 4) replaces the first gate stack 234 with a high-k/metal gate (HK/MG) stack 235. Referring to FIGS. 12A and 12B, a dielectric layer 242 is deposited over the device 200, and is planarized (e.g., by a chemical mechanical planarization (CMP) process) to expose the gate stack 234 (FIG. 11A). The dielectric layer 242 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer 242 may be deposited by a PECVD process, a flowable CVD process, or other suitable deposition technique.

Figure 13B:
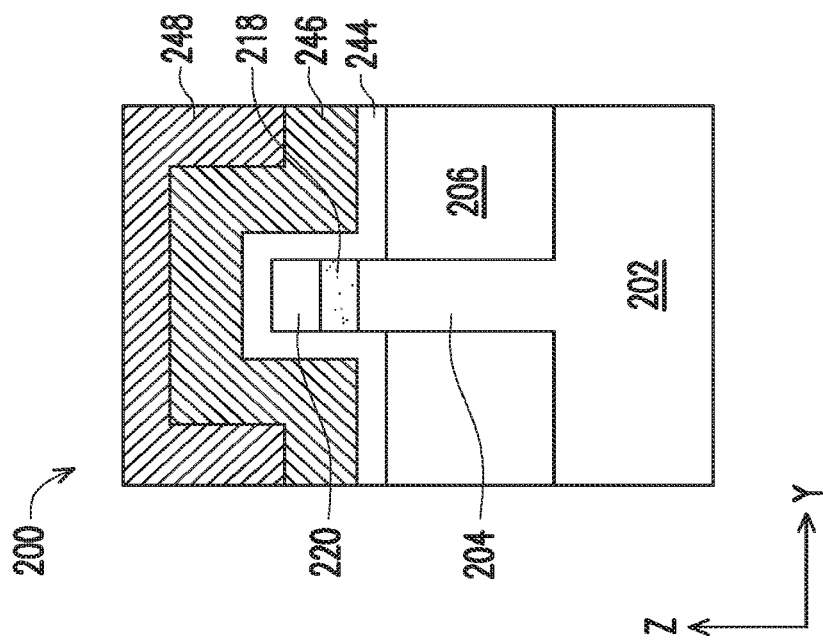
Figure 13A:
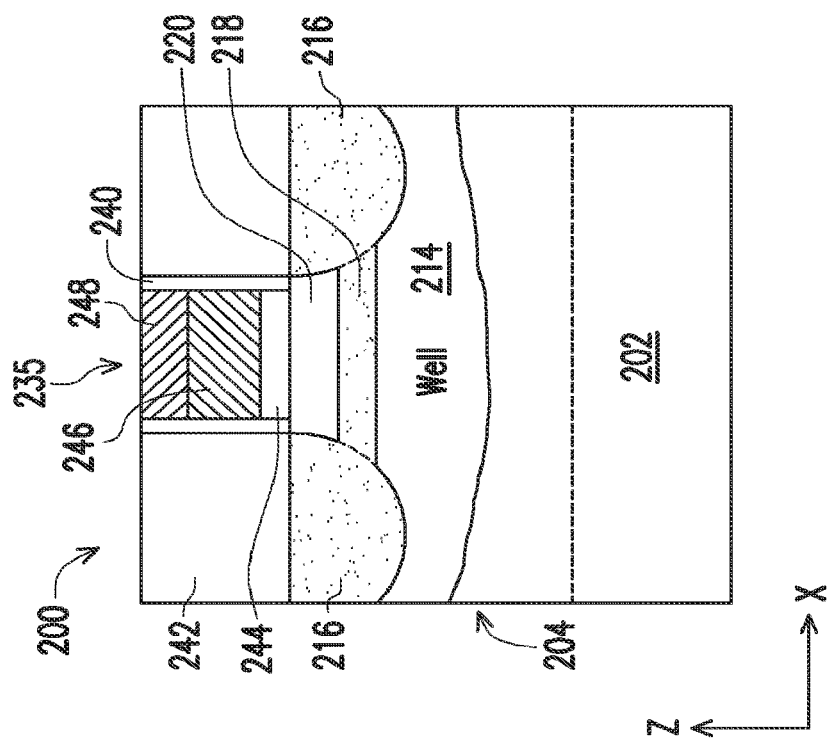

Subsequently, the various layers of the gate stack 234 are removed by one or more etching processes, thereby forming a trench 241 between opposing walls of the spacer 240. Referring to FIGS. 13A and 13B, various layers are deposited into the trench 241 to form the HK/MG stack 235, including a high-k gate dielectric layer 244, a work function metal layer 246, and a metal electrode layer 248. The HK/MG stack 235 may further include a capping layer, a diffusion barrier layer, and/or an interfacial layer.

In an embodiment, the high-k gate dielectric layer 244 may include a dielectric material such as hafnium oxide ($HfO_2$), zirconium oxide ($ZrO_2$), lanthanum oxide ($La_2O_3$), titanium oxide (TiO$_2$), yttrium oxide (Y$_2$O$_3$), strontium titanate (SrTiO$_3$), other suitable metal-oxides, or combinations thereof. The high-k gate dielectric layer 244 may be formed by ALD and/or other suitable methods.

In an embodiment, the work function metal layer 246 may be an n-type work function metal layer for NMOS FinFET varactor 200 or a p-type work function metal layer for PMOS FinFET varactor 200. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), or combinations thereof. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The work function metal layer 246 may include a plurality of layers and may be deposited by CVD, PVD (physical vapor deposition), and/or other suitable process. In the present embodiment, the work function metal layer 246 is designed to work with the characteristics of the region 218 to tune the C-V curve of the varactor 200. For example, if the well implantation in the operation 404 creates a 0.2V effective threshold voltage in the region 218, and the counter channel ion implantation in the operation 408 creates a −0.4V effective threshold voltage in the region 218, then the region 218 has a net −0.2V effective threshold voltage. In this case, the work function of the gate 234 can be designed to be 0.2V to obtain a net threshold voltage, Vt, at 0V. Alternatively, the work function of the gate 234 can be designed to obtain a net threshold voltage near 0V such as between 0V and 0.3V.

In an embodiment, the metal electrode layer 248 may include aluminum (Al), tungsten (W), cobalt (Co), copper (Cu), and/or other suitable materials. The metal electrode layer 248 may be formed by CVD, PVD, plating, and/or other suitable processes.

At operation 416, the method 400 (FIG. 4) performs further steps to form a final device. For example, the method 400 may form a gate contact electrically connecting the gate stack 235, form S/D contacts electrically connecting the S/D features 216, form metal interconnects to connect the S/D contacts, and form metal interconnects to connect the gate contact (or gate terminal) and the S/D contacts (or S/D terminals) to appropriate circuit nodes to form a complete IC or a part thereof such as the VCO 100 of FIG. 1.

Although not intended to be limiting, one or more embodiments of the present disclosure provide many benefits to a FinFET varactor and the formation thereof. For example, the FinFET varactor according to embodiments of the present disclosure has a low Vt which enables a tuning range of the varactor centered at 0V or at near 0V (e.g., 0.1V). This greatly reduces the power consumption of the circuit where the FinFET varactor is used. Methods of forming the low Vt FinFET varactor according to the present disclosure are fully compliant with existing FinFET manufacturing flow and can be easily integrated therein. Also, the provided subject matter allows the tuning of the C-V curve of the varactor by adjusting channel ion implantation conditions (e.g., dopant species, dose, and energy level) and the work function of the metal gate.

In one exemplary aspect, the present disclosure is directed to a method of forming of a semiconductor device. The method includes receiving a precursor having a semiconductor layer over a substrate, the semiconductor layer having a channel region and source and drain regions on opposite sides of the channel region. The method further includes forming a well in the semiconductor layer, the well having a first dopant. The method further includes implanting a second dopant into the well, the second dopant and the first dopant being of opposite doping types, a first portion of the well having a higher concentration of the second dopant than the first dopant, a second portion of the well under the first portion having a higher concentration of the first dopant than the second dopant. The method further includes forming a gate stack over the channel region; and forming source and drain features in the source and drain regions, wherein the first portion of the well electrically connects the source and drain features.

In another exemplary aspect, the present disclosure is directed to a method of forming a FinFET device. The method includes receiving a precursor having a substrate, an isolation feature over the substrate, and a fin protruding out of the substrate and through the isolation feature, the fin having a channel region and source and drain regions on opposite sides of the channel region. The method further includes implanting a first dopant into the fin, thereby forming a well in the fin; and forming a mask covering areas of the precursor and leaving at least the channel region of the fin uncovered. The method further includes implanting a second dopant into the well through the mask where the second dopant and the first dopant are of opposite doping types, resulting in a first portion of the well having a higher concentration of the second dopant than the first dopant and a second portion of the well under the first portion having a lower concentration of the second dopant than the first dopant. The method further includes forming a first gate stack over the channel region of the fin; forming source and drain features in the source and drain regions of the fin, wherein the first portion of the well conductively connects the source and drain features; and replacing the first gate stack with a high-k/metal gate stack.

In yet another exemplary aspect, the present disclosure is directed to a fin FinFET varactor. The FinFET varactor includes a substrate; a semiconductor fin over the substrate; and a gate stack engaging the semiconductor fin. The semiconductor fin includes a well doped with a first dopant; a channel region under the gate stack; and a source region and a drain region defined in the well and on opposite sides of the channel region. The source and drain regions are doped with a second dopant. A first portion of the well under the gate stack is doped with a third dopant and has a higher concentration of the third dopant than the first dopant. The first dopant is of a first doping type, and the second and third dopants are of a second doping type that is opposite to the first doping type.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a FinFET varactor, the method comprising:

performing a first implantation process with a first type dopant on a fin to form a first doped region in the fin, wherein the fin has a first portion disposed between a second portion and a third portion, and further wherein the first doped region spans the first portion of the fin, the second portion of the fin, and the third portion of the fin;

performing a second implantation process with a second type dopant on the fin to form a second doped region in the first doped region in the first portion of the fin, wherein the second type dopant is different than the first type dopant and the second doped region is disposed between a first sub-portion of the first doped region in the first portion of the fin and a second sub-portion of the first doped region in the first portion of the fin;

forming a gate structure over the first portion of the fin;

performing a third implantation process with the second type dopant on the fin to form a fourth doped region in the first doped region in the second portion of the fin and a fifth doped region in the first doped region in the third portion of the fin, wherein the first sub-portion of the first doped region in the first portion of the fin and the second doped region each extend between the fourth doped region and the fifth doped region; and tuning the first implantation process and the second implantation process to achieve:
  a first dopant concentration profile of the first type dopant having a first bell shape from the first sub-portion of the first doped region in the first portion of the fin to the second doped region to the second sub-portion of the first doped region in the first portion of the fin,
  a second dopant concentration profile of the second type dopant having a second bell shape from the first sub-portion of the first doped region in the first portion of the fin to the second doped region to the second sub-portion of the first doped region in the first portion of the fin, and
  the first bell shape is different than the second bell shape.

2. The method of claim 1, wherein the tuning the first implantation process and the second implantation process includes utilizing a first doping energy during the first implantation process and a second doping energy during the second implantation process, wherein the first doping energy is greater than the second doping energy.

3. The method of claim 2, wherein the first doping energy is about 10 keV to about 1,000 keV and the second doping energy is about 10 keV to about 50 keV.

4. The method of claim 1, wherein the tuning the first implantation process and the second implantation process includes utilizing a first dopant concentration during the first implantation process and a second dopant concentration during the second implantation process, wherein the first dopant concentration is different than the second dopant concentration.

5. The method of claim 4, wherein the first dopant concentration is about $1\times10^{11}$ cm$^{-3}$ to about $1\times10^{14}$ cm$^{-3}$ and the second dopant concentration is about $1\times10^{12}$ cm$^{-3}$ to about $1\times10^{14}$ cm$^{-3}$.

6. The method of claim 1, further comprising masking the second portion of the fin and the third portion of the fin during the performing of the second implantation process.

7. The method of claim 1, wherein each of the fourth doped region and the fifth doped region is a heavily doped source/drain feature, and further wherein the performing the second implantation process with the second type dopant on the fin further forms a lightly doped source/drain feature in the first doped region in the second portion of the fin and the first doped region in the third portion of the fin.

8. The method of claim 1, wherein the first type dopant is an n-type dopant and the second type dopant is a p-type dopant.

9. The method of claim 1, wherein the first type dopant is a p-type dopant and the second type dopant is an n-type dopant.

10. A method of fabricating a FinFET varactor, the method comprising:
  forming a fin over a substrate;
  performing a first implantation process and a second implantation process on a first portion of the fin, such that the first portion of the fin includes a first type dopant and a second type dopant, wherein the first type dopant is different than the second type dopant and the first implantation process and the second implantation process are tuned to achieve:
    a first dopant concentration of the first type dopant in the first portion of the fin and a second dopant concentration of the second type dopant in the first portion of the fin that vary from a top surface of the fin to a first depth in the fin,
    the first dopant concentration of the first type dopant greater than the second dopant concentration of the second type dopant from a second depth to a third depth in the first portion of the fin, wherein each of the second depth and the third depth is less than the first depth, and
    the first dopant concentration of the first type dopant increases from the second depth to a peak dopant concentration at a fourth depth and decreases from the peak dopant concentration at the fourth depth to the third depth, wherein the fourth depth is greater than the second depth and less than the third depth;
  forming a gate structure over the first portion of the fin; and
  forming a first source/drain feature in a second portion of the fin and a second source/drain feature in a third portion of the fin, wherein the gate structure is disposed between the first source/drain feature and the second source/drain feature, and further wherein the first source/drain feature and the second source/drain feature include the first type dopant.

11. The method of claim 10, wherein the peak dopant concentration is a first peak dopant concentration, the fourth depth of the first peak dopant concentration of the first type dopant is less than a depth of a second peak dopant concentration of the second type dopant.

12. The method of claim 10, wherein the peak dopant concentration is a first peak dopant concentration and a first dopant level of the first peak dopant concentration of the first type dopant is less than a second dopant level of a second peak dopant concentration of the second type dopant.

13. The method of claim 10, wherein the peak dopant concentration is a first peak dopant concentration and a first dopant level of the first peak dopant concentration of the first type dopant is greater than a second dopant level of a second peak dopant concentration of the second type dopant.

14. The method of claim 10, wherein the forming the first source/drain feature and the second source/drain feature includes performing a third implantation process, wherein a dopant concentration of the first type dopant in the first source/drain feature and the second source/drain feature is greater than the dopant concentration of the first type dopant from the second depth to the third depth in the first portion of the fin.

15. The method of claim 10, further comprising replacing a dummy gate of the gate structure with a metal gate after forming the first source/drain feature and the second source/drain feature.

16. The method of claim 10, further comprising performing a first annealing process after performing the first implantation process and a second annealing process after performing the second annealing process.

17. A method of fabricating a FinFET varactor, the method comprising:
   forming a fin extending from a substrate;
   performing a well ion implantation process to form a well that includes a first type dopant, wherein the well ion implantation process implements first implant conditions;
   performing a channel ion implantation process to form a doped region in a channel region of the fin, wherein:
      the doped region includes a second type dopant, wherein the second type dopant is opposite the first type dopant,
      the doped region is disposed at a depth in the well, such that the doped region is disposed between a first portion of the well in the channel region and a second portion of the well in the channel region,
      the channel ion implantation process implements second implant conditions that are different than the first implant conditions, and
      the first implant conditions and the second implant conditions are tuned to achieve a dopant profile of the second type dopant in the channel region that increases from the first portion of the well in the channel region to a peak concentration in the doped region and decreases from the peak concentration in the doped region to the second portion of the well in the channel region;
   forming a gate stack over the channel region of the fin; and
   forming a first source/drain feature in a first source/drain region of the fin and a second source/drain feature in a second source/drain region of the fin, wherein the channel region is disposed between the first source/drain region and the second source/drain region, and wherein the first source/drain feature and the second source/drain feature include the second type dopant.

18. The method of claim 17, wherein the performing the channel ion implantation process includes reducing a threshold voltage of the FinFET varactor.

19. The method of claim 17, wherein the forming the first source/drain feature and the second source/drain feature includes:
   etching the first source/drain region of the fin to form a first recess and the second source/drain region of the fin to form a second recess; and
   epitaxially growing a semiconductor material in the first recess and the second recess, wherein the semiconductor material is doped with the second type dopant.

20. The method of claim 17, further comprising coupling the first source/drain feature and the second source/drain feature to a first voltage and coupling the gate stack to a second voltage.

* * * * *